(12) United States Patent
Imai et al.

(10) Patent No.: US 8,354,157 B2
(45) Date of Patent: Jan. 15, 2013

(54) SUPPORT PLATE, METHOD FOR PRODUCING THE SAME, AND METHOD FOR PROCESSING SUBSTRATE

(75) Inventors: Hirofumi Imai, Kawasaki (JP); Koki Tamura, Kawasaki (JP); Takahiro Asai, Kawasaki (JP); Takahiro Yoshioka, Kawasaki (JP); Yoshihiro Inao, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 354 days.

(21) Appl. No.: 12/794,096

(22) Filed: Jun. 4, 2010

(65) Prior Publication Data
US 2010/0310817 A1    Dec. 9, 2010

(30) Foreign Application Priority Data
Jun. 9, 2009    (JP) .................................. 2009-138296

(51) Int. Cl.
*B32B 3/02*    (2006.01)
*B32B 37/00*    (2006.01)
*G03F 7/20*    (2006.01)

(52) U.S. Cl. ........ 428/119; 156/292; 428/116; 428/194; 428/195.1; 430/320

(58) Field of Classification Search .................. 428/119, 428/116, 195, 194
See application file for complete search history.

(56) References Cited

U.S. PATENT DOCUMENTS
2,906,423 A * 9/1959 Sandhage ...................... 215/249
6,718,223 B1 * 4/2004 Iwakata et al. ................ 700/121
2005/0170612 A1    8/2005 Miyanari et al.

FOREIGN PATENT DOCUMENTS
JP    2005-191550    7/2005
JP    2008-258418    10/2008

* cited by examiner

*Primary Examiner* — Brent O'Hern
(74) *Attorney, Agent, or Firm* — Wenderoth, Lind & Ponack, L.L.P.

(57) ABSTRACT

This invention provides a support plate which makes it possible to stably perform a step for separating from a support plate a wafer which has been processed while preventing delay in time taken for this step. The support plate of this invention is a support plate for supporting a substrate via an adhesive, including: a plate-shaped part having a surface which is in contact with the adhesive; and at least one spacer provided on the surface which is in contact with the adhesive.

16 Claims, 2 Drawing Sheets

SUPPORT PLATE, METHOD FOR PRODUCING THE SAME, AND METHOD FOR PROCESSING SUBSTRATE

This Nonprovisional application claims priority under 35 U.S.C. §119(a) on Patent Application No. 2009-138296 filed in Japan on Jun. 9, 2009, the entire contents of which are hereby incorporated by reference.

TECHNICAL FIELD

The present invention relates to a support plate and a method for producing the same, and a method for processing a substrate with use of the support plate.

Background Art

In recent years, due to multiple functioning of mobile phones, digital AV devices, IC cards, and the like, demands have been increasing for downsizing, reduction in thickness, and higher integration of semiconductor chips mounted in the above devices. In order to meet the demands, the semiconductor chips integrated in the above devices should be thin semiconductor chips. Currently, a semiconductor wafer, which is a base of the semiconductor chip, has a thickness (film thickness) of approximately 125 µm to approximately 150 µm. However, for the above reason, the semiconductor wafer is said to need to have a thickness of approximately 25 µm to approximately 50 µm for a next-generation chip.

However, since the semiconductor wafer ground to a thickness of approximately 25 µm to approximately 50 µm is thin, such the semiconductor wafer has a low strength, and therefore a crack and/or warpage easily occurs in the semiconductor wafer. In order to deal with this, there has been developed a method for bonding, to a semiconductor wafer to be ground, a so-called protective substrate (hereinafter, referred to as a support plate) such as a glass or a rigid plastic so as to maintain a strength of the semiconductor wafer, thereby preventing a crack and warpage of the semiconductor wafer (for example, see Patent Literature 1).

In the above method, an adhesive solution is applied to a surface of a substrate on which surface a circuit is to be formed, and thereafter the adhesive solution is predried so that a shape of an adhesive layer can be maintained. Subsequently, a support plate is pressed onto the adhesive layer so that the support plate is combined thereto. Then, at the same time with the pressing or after the pressing, the adhesive layer is dried so that the substrate is bonded to the support plate.

Citation List
[Patent Literature]
  [Patent Literature 1]
  Japanese Patent Application Publication, Tokukai, No. 2005-191550 A (Published on Jul. 14, 2005)

SUMMARY OF INVENTION

Technical Problem

However, the above conventional method may delay time taken for a step for separating from the support plate the wafer which has been processed.

Specifically, there may be a case where the wafer supported by the support plate via the adhesive is depressed toward the support plate with its own weight during the step for drying the adhesive and/or processing the wafer. Typically, the support plate has a through-hole through which a liquid for dissolving the adhesive is flown while the wafer which has been processed is separated from the support plate. Due to the depressing, the adhesive can intrude into the through-hole. As a result, a flow rate of the solution for dissolving the adhesive may be restricted while the wafer is separated from the support plate. This may delay time taken for this step.

The present invention was made in view of the foregoing problem, and an object of the present invention is to achieve a support plate which makes it possible to stably perform a step for separating from a support plate a wafer having been processed, while preventing delay in time taken for this step.

Solution to Problem

In order to solve the foregoing problem, a support plate of the present invention is a support plate for supporting a substrate via an adhesive, including: a plate-shaped part having a surface which is in contact with the adhesive; and at least one spacer provided on the surface which is in contact with the adhesive.

With this arrangement, since the support plate includes the spacer on the surface which is in contact with the adhesive, it is possible to prevent the substrate from being depressed toward the support plate. Typically, the support plate has a through-hole through which a solution for dissolving the adhesive is flown while the wafer which has been processed is separated from the support plate. The above arrangement can prevent a case where the adhesive intrudes into the through-hole due to the depressing. Consequently, it is possible to stably flow the solution for dissolving the adhesive while the wafer is separated from the support plate, thereby allowing the step for the separation to be performed stably. Thus, the above arrangement makes it possible to stably perform the step for separating from the support plate the wafer which has been processed, while preventing delay in time taken for this step.

In order to solve the foregoing problem, a method of the present invention for processing a substrate including the steps of: (i) supporting a substrate with use of the support plate of the present invention; and thereafter (ii) processing the substrate.

With this method, the substrate is supported with use of the support plate, and thereafter the substrate is processed. This makes it possible to process the substrate while preventing the substrate from being depressed toward the support plate. Typically, the support plate has the through-hole through which the solution for dissolving the adhesive is flown while the wafer which has been processed is separated from the support plate. The above method prevents a case where the adhesive intrudes into the through-hole due to the depressing. Consequently, it is possible to stably flow the solution for dissolving the adhesive while the wafer is separated from the support plate. Thus, the above method makes it possible to stably perform the step for separating from the support plate the wafer which has been processed, while preventing delay in time taken for this step.

In order to solve the foregoing problem, a method for producing a support plate of the present invention includes the steps of: laminating a photoresist material on a plate-shaped part; and patterning the photoresist material so that at least one spacer is formed.

The above method makes it possible to easily form the spacer of the present invention.

ADVANTAGEOUS EFFECTS OF INVENTION

As described above, a support plate of the present invention is a support plate for supporting a substrate via an adhesive, including: a plate-shaped part having a surface which is in contact with the adhesive; and at least one spacer provided on the surface which is in contact with the adhesive.

This makes it possible to stably perform the step for separating from the support plate the wafer which has been processed, while preventing delay in time taken for this step.

Further, as described above, a method of the present invention for processing a substrate includes the steps of: (i) supporting a substrate with use of the support plate of the present invention; and thereafter (ii) processing the substrate.

This makes it possible to stably perform the step for separating from the support plate the wafer which has been processed, while preventing delay in time taken for this step.

Furthermore, as described above, a method for producing a support plate of the present invention includes the steps of: laminating a photoresist material on a plate-shaped part; and patterning the photoresist material so that at least one spacer is formed.

This makes it possible to easily form the spacer of the present invention.

DESCRIPTION OF EMBODIMENTS

The following will describe an embodiment of the present invention.

Note that a range expressed by the wording "A to B" herein means a range that includes "A" as the lowermost limit of the range and "B" as the uppermost limit of the range.

(I) Support Plate

Figure 1:
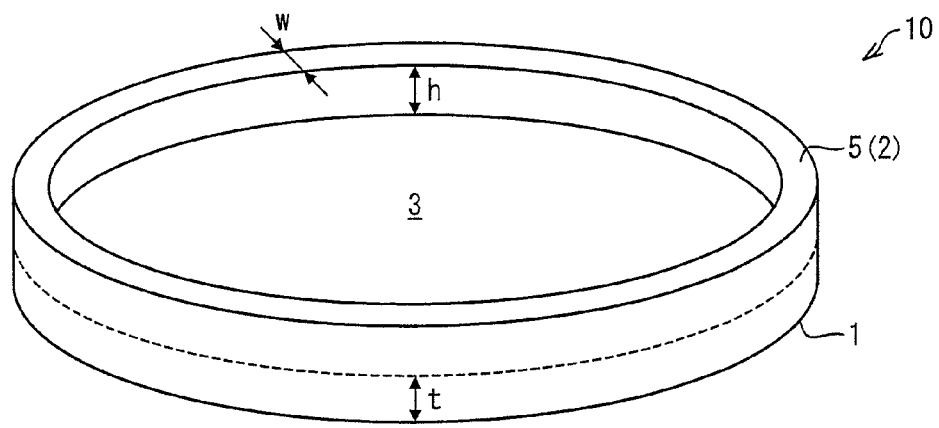
FIG. 1 is a perspective view schematically showing an example of a support plate of the present embodiment.
Figure 2:
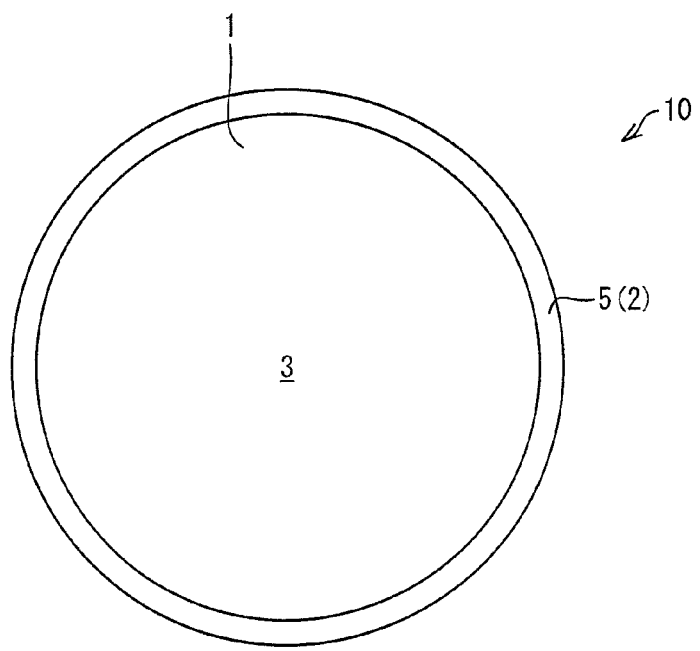
FIG. 2 is a top view schematically showing the example of the support plate of the present embodiment.

FIG. 1 is a perspective view schematically showing a support plate 10 of the present embodiment. FIG. 2 is a top view schematically showing the support plate 10 of the present embodiment.

Figure 3:
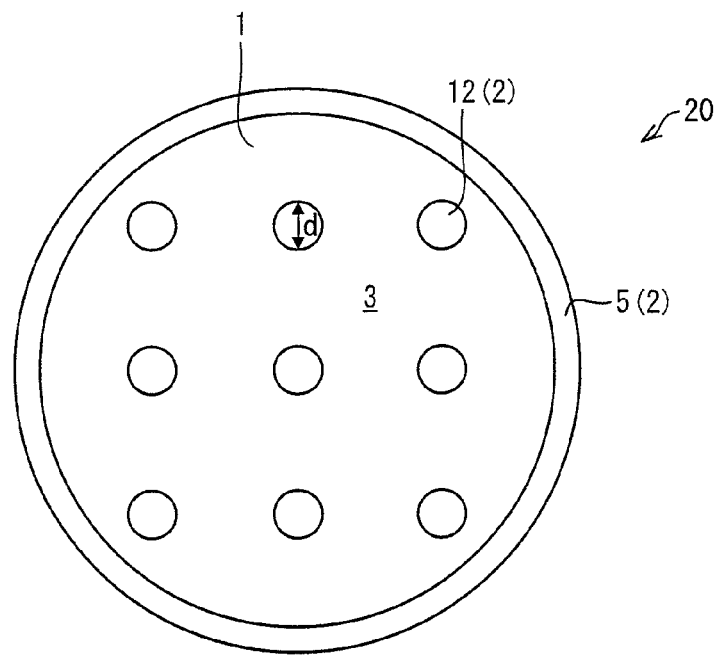
FIG. 3 is a top view schematically showing another example of the support plate of the present embodiment.
Figure 4:
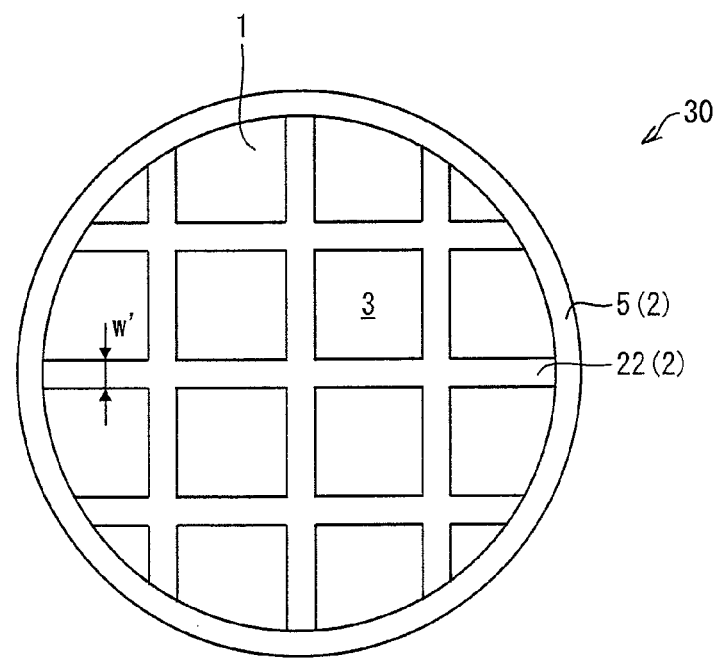
FIG. 4 is a top view schematically showing further another example of the support plate of the present embodiment.

FIG. 3 is a top view schematically showing a support plate 20, which is another example of the support plate of the present embodiment. FIG. 4 is a top view schematically showing a support plate 30, which is further another example of the support plate of the present embodiment.

Note that FIGS. 1 through 4 are just for schematically showing the support plates of the present embodiment, and the present invention is not limited to scales in FIGS. 1 through 4.

The support plate 10 of the present embodiment supports a substrate via an adhesive. As shown in FIGS. 1 and 2, the support plate 10 includes: a plate-shaped part 1 having a surface 3 which is in contact with the adhesive; and at least one spacer 2 provided on the surface 3 which is in contact with the adhesive.

[Plate-Shaped Part]

The plate-shaped part 1 has a plurality of through-holes (not illustrated) through which a solution for dissolving the adhesive is flown while a wafer which has been processed is separated from the support plate 10. An inner diameter of each through-hole is not particularly limited. However, each through hole may be formed to have an inner diameter in a range of 10 µm to 1000 µm. The number of the through-holes formed is preferably such that the through-holes account for 20% to 50% of an area of the support plate, more preferably 30% to 40% of the area of the support plate.

A shape of the plate-shaped part 1 is not particularly limited, as long as it has a plate-like shape. The plate-shaped part 1 preferably has a surface whose shape is the same as that of the substrate to be fixed.

A thickness t of the plate-shaped part 1 is not particularly limited, as long as it is similar to that of a conventionally-known support plate. A material of the plate-shaped part 1 is not particularly limited, as long as it is a material which is used for a conventionally-known support plate and which does not mix with the adhesive or does not generate gas and/or the like upon heated. Examples of the material of the plate-shaped part 1 encompass glass, resin, and silicon. Of these, glass is particularly preferable.

[Spacer]

In the support plate 10 of the present embodiment, the at least one spacer 2 includes a protrusion 5 continuously protruding along an outer circumference of the plate-shaped part 1.

A height h of the protrusion 5 is not particularly limited. However, the height h is preferably in a range of 5 µm to 500 µm. Further, a width w of the protrusion 5 is not particularly limited. However, the width w is preferably in a range of 10 µm to 5000 µm.

In order to more reliably prevent the substrate from being depressed toward the support plate, as shown in FIG. 3, the at least one spacer 2 may further include a plurality of columnar bodies 12.

A height of each columnar body 12 is not particularly limited. However, the height of each columnar body 12 is preferably in a range of 5 µm to 500 µm. A width or a diameter d of each columnar body 12 are not particularly limited, either. However, the width or the diameter d of each columnar body 12 is preferably in a range of 10 µm to 5000 µm. Further, an area of the surface 3 which area is in contact with the columnar bodies 12 preferably accounts for 50% to 95% of an area of the surface 3 which area is in contact with the adhesive.

A shape of each columnar body 12 is not particularly limited, as long as it is columnar. Examples of the shape of each columnar body 12 encompass: polygonal columns such as a triangular column and a quadrangular column; and a cylindrical column.

Further, in order to more reliably prevent the substrate from being depressed toward the support plate, as shown in FIG. 4, the at least one spacer 2 may further include a plurality of plate-shaped objects 22 disposed in a lattice, in addition to the protrusion 5.

A height of each plate-shaped object 22 is not particularly limited. However, the height of each plate-shaped object 22 is preferably in a range of 5 µm to 500 µm. A width w' of each plate-shaped object 22 is not particularly limited, either. However, the width w' is preferably in a range of 10 µm to 5000 µm. An area of the surface 3 which area is in contact with the plate-shaped objects 22 preferably accounts for 50% to 95% of the area of the surface 3 which area is in contact with the adhesive.

In the present embodiment, as well as the material of the plate-shaped part 1, a material of the spacer 2 (the protrusion 5, the columnar bodies 12, the plate-shaped objects 22) is not particularly limited, as long as it is a material used for a conventionally-known support plate. Examples of the material encompass resin such as an epoxy resin, glass, and silicon. Of these, glass is particularly preferable. In a case where the support plate is provided with a plurality of spacers 2, respective materials of the spacers 2 may be the same or may be different from each other.

As described above, each of the support plates 10, 20, and 30 of the present embodiment includes the at least one spacer 2 provided on the surface 3 which is in contact with the adhesive. This prevents the substrate from being depressed toward the support plate. Further, this prevents a case where the adhesive intrudes into the holes of the support plate due to the depressing. Consequently, it is possible to stably flow the solution for dissolving the adhesive while the wafer is separated from the support plate, thereby allowing the step for the separation to be performed stably.

The foregoing has explained (i) the case where the at least one the spacer 2 includes the protrusion 5 continuously protruding along the outer circumference of the plate-shaped part 1 and (ii) the case where the at least one the spacer 2 includes the columnar bodies 12 or the plurality of plate-shaped objects 22 disposed in a lattice, in addition to the protrusion 5. However, the present invention is not limited to these.

Alternatively, the at least one the spacer 2 may include only the columnar bodies 12 or only the plate-shaped objects 22. Further alternatively, the at least one the spacer 2 may include the columnar bodies 12 and the plate-shaped objects 22. Still further alternatively, the at least one the spacer 2 may include all of the protrusion 5, the columnar bodies 12, and the plate-shaped objects 22. These can provide substantially the same effects as those of the present embodiment, as long as they can prevent the substrate from being depressed toward the support plate.

As described above, in a support plate of the present invention, it is preferable that the at least one spacer includes a protrusion continuously protruding along an outer circumference of the plate-shaped part.

With this arrangement, it is possible to more reliably prevent the substrate from being depressed toward the support plate. This makes it possible to more stably perform the step for separating from the support plate the wafer which has been processed, while preventing delay in time taken for this step.

Further, in the support plate of the present invention, it is preferable that the at least one spacer further includes a plurality of columnar bodies.

With this arrangement, it is possible to more reliably prevent the substrate from being depressed toward the support plate. This makes it possible to more stably perform the step for separating from the support plate the wafer which has been processed, while preventing delay in time taken for this step.

Furthermore, in the support plate of the present invention, it is preferable that the at least one spacer further includes a plurality of plate-shaped objects disposed in a lattice.

With this arrangement, it is possible to prevent the substrate from being depressed toward the support plate more reliably. This makes it possible to more stably perform the step for separating from the support plate the wafer which has been processed, while preventing delay in time taken for this step.

Moreover, in the support plate of the present invention, the plate-shaped part is preferably made of glass.

With this arrangement, it is possible to perform a process such as light emission through the plate-shaped part.

(II) Method for Producing Support Plate

A method for producing a support plate of the present embodiment is a method for producing a support plate by forming a spacer by laminating and patterning a photoresist material on a plate-shaped part.

The method for producing the support plate includes, e.g., a plate-shaped part producing step, a photoresist applying step, an exposure step, and a development step. If necessary, a post-exposure baking process step may be performed after the exposure step but before the development step. Further, if necessary, a post-development baking process step may be performed after the development step.

[Plate-Shaped Part Producing Step]

The plate-shaped part producing step refers to a step for producing a plate-shaped part. The plate-shaped part may be a conventionally-known, plate-shaped support plate, and may be produced by a conventionally-known method for producing a support plate. For example, the plate-shaped part may be produced by a method described in Japanese Patent Application Publication, Tokukai, No. 2008-258418 A.

[Photoresist Application Step]

The photoresist application step refers to a step for applying a photoresist onto a surface of the plate-shaped part.

The application of the photoresist may be performed by a conventionally-known method, examples of which encompass: a method (dip-coating method) in which the plate-shaped part is immersed in a photoresist; a method in which a liquid photoresist is applied onto the plate-shaped part by means of a spin-coating method; and a method in which a film-shaped photoresist (dry film resist) is laminated on the plate-shaped part.

In a case where the spacer is made of resin, for example, an epoxy photoresist may suitably be used as a material of the photoresist. In a case where the spacer is made of glass, for example, a photoresist containing glass powders may be used as the material of the photoresist.

Note that, in the case involving use of the photoresist containing glass powders, a glass spacer can be formed by burning out an organic component at a high temperature after patterning with the photoresist is performed.

[Exposure Step]

The exposure step refers to a step for performing exposure so as to transfer a mask pattern onto the surface of the plate-shaped part on which surface the photoresist has been applied.

Conditions for the exposure may be optionally set, depending on the material of the resist used. For example, light of a wavelength of 200 nm to 600 nm may be used. An amount of exposure is not particularly limited. However, in a case where the light has a wavelength of 350 nm, the exposure can be performed with, e.g., an amount of exposure in a range of 50 mJ/cm$^2$ to 500 mJ/cm$^2$.

[Post-Exposure Baking Process Step]

The post-exposure baking process step refers to a step for performing a baking process on the plate-shaped part having been subjected to the exposure.

Conditions for the post-exposure baking process step may be optionally set, depending on the material of the resist used. For example, this step may be performed at a temperature within a range of 50° C. to 250° C., for a period of 1 minute to 90 minutes.

[Development Step]

The development step refers to a step for separating an unnecessary part of the plate-shaped part having been subjected to the heating treatment, by dissolving the unnecessary part in a developer.

Examples of the developer encompass PGMEA (propylene glycol monomethyl ether acetate), PGME (propylene glycol monomethyl ether), cyclohexanone, and methyl amyl ketone.

[Post-Development Baking Process Step]

The post-development baking process step refers to a step for performing a baking process on the plate-shaped part having been subjected to the development.

Conditions for the post-development baking process step may be optionally set, depending on the material of the resist used. For example, this step may be performed at a temperature within a range of 50° C. to 250° C., for a period of 1 minute to 90 minutes.

The foregoing has explained the case where the support plate is produced by forming the spacer by laminating and patterning the photoresist material on the plate-shaped part. However, the present invention is not limited to this. Alternatively, for example, a spacer may be produced by subjecting the plate-shaped part to a mechanical process. However, the above-described method of the present embodiment is preferable, since this method can produce a support plate more easily and with a high accuracy.

(III) Method for Processing Substrate

A method of the present embodiment for processing a substrate includes the steps of: supporting a substrate with use of a support plate of the above-described present embodiment; and thereafter processing the substrate.

The above processing method includes, for example, a substrate fixing step, a substrate processing step, and a substrate separating step.

[Substrate Fixing Step]

The substrate fixing step refers to a step for fixing a substrate to be processed, onto a support plate via an adhesive.

For example, an adhesive solution is applied to a substrate, and the adhesive solution is predried so that a shape of an adhesive layer is maintained. Subsequently, the support plate is pressed onto the adhesive layer so that the support plate is combined thereto. Then, at the same time with the pressing or after the pressing, the adhesive layer is dried so that the substrate to be processed is fixed onto the support plate via the adhesive.

The application of the adhesive solution may be performed by, e.g., a spin-coating method, a spray-coating method, a bar-coating method, or a dip-coating method. Further, in the case of the film-shaped resist, the application may be performed by laminating or the like.

The adhesive solution may be any of various adhesive solutions described in Japanese Patent Application Publication, Tokukai, No. 2005-191550 A, such as the one prepared by dissolving in a solvent one or a mixture of two or more of a novolac resin, an epoxy resin, an amide resin, a silicone resin, an acrylic resin, an urethane resin, polystyrene, polyvinyl ether, polyvinyl acetate, and modified products thereof.

The solvent is preferably the one that allows dissolution of the above substance(s) and can be formed into a film on a wafer evenly. Examples of the solvent encompass various solvents described in Japanese Patent Application Publication, Tokukai, No. 2005-191550 A. Further, in order to improve evenness of a film thickness, a surfactant may be added thereto.

In a case involving use of any of the above adhesives, the predrying can be performed at a temperature of 200° C. or lower (40° C. to 200° C.), and the drying step can be performed at a temperature of 300° C. or lower (40° C. to 300° C.).

[Substrate Processing Step]

The substrate processing step refers to a step for performing a process of any of various kinds on the substrate fixed on the support plate.

The process may be a conventionally-known process to be performed on a substrate, examples of which encompass: a thickness reduction process such as a backgrinding (BG) process; a heating treatment step; and a lithography step.

[Substrate Separating Step]

The substrate separating step refers to a step for dissolving the adhesive with a separating solution so as to separate from the support plate the substrate which has been processed.

The separating solution may be any of conventionally-known solvents described in Japanese Patent Application Publication, Tokukai, No. 2005-191550 A.

Here, the method of the present embodiment for processing the substrate uses the above-described support plate of the present embodiment. This makes it possible to stably perform the substrate separating step, while preventing delay in time taken for this step.

As described above, in the method of the present invention for processing the substrate, in the processing, the substrate supported with use of the support plate is preferably subjected to a heating treatment.

According to the above method, it is possible to perform the heating treatment on the substrate while preventing the substrate from being depressed toward the support plate.

EXAMPLES

The following will describe the present invention in greater detail based on Examples. However, the present invention is not limited to the Examples below.

Example 1

According to a method described in Japanese Patent Application Publication, Tokukai, No. 2008-258418 A, a plate-shaped object made of glass was processed so that a hole was made through the plate-shaped object. Thus, a perforated plate-shaped object (an inner diameter of each through-hole: 300 μm, a pitch of the through-holes: 500 μm) was produced.

Next, on the perforated plate-shaped object, a dry film photoresist (product name: "TMMF (Registered Trademark)-2010"; manufactured by Tokyo Ohka Kogyo Co., Ltd.) was laminated by a laminating device (manufactured by Taisei Laminator Co., Ltd.) under the conditions of a temperature of 70° C., a speed of 0.5 m/min, and a pressure of 2.0 kg/cm². Thus, a photoresist layer of 10 μm was formed.

Then, the plate-shaped object on which the photoresist layer had been formed was exposed to light of 200 mJ/cm² (350 nm) with a parallel light exposure device, and was prebaked on a hot plate at 90° C. for 10 minutes. Subsequently, the plate-shaped object was subjected to development with PGMEA (propylene glycol monomethyl ether acetate) for 10 minutes, and was baked at 200° C. for 60 minutes. Thus, a support plate as shown in FIG. 1 was produced that had a spacer continuously protruding along an outer circumference of a plate-shaped part and having a height (h) of 10 μm and a width (w) of 1000 μm.

Subsequently, an adhesive (product name: "TZNR (Registered Trademark)-A0006 PM", manufactured by Tokyo Ohka Kogyo Co., Ltd.) was applied to a substrate, and then the adhesive was predried at 110° C. for 3 minutes, at 150° C. for 3 minutes, and at 200° C. for 3 minutes, so that an adhesive layer having a thickness of 30 μm was formed. Then, the support plate produced was pressed onto the adhesive layer so that the support plate was combined thereto. Thereafter, a distance between the support plate and the substrate and a rate of change in the distance were obtained (1) before a process, (2) after a process at 150° C. for an hour, and (3) after a process at 200° C. for an hour. The results thereof are shown in Table 1.

Example 2

The same procedure as in Example 1 was performed, except that a thickness of a photoresist to be laminated was 30 μm rather than 10 μm. Thus, a support plate as shown in FIG. 1 was produced that had a spacer having a height (h) of 30 μm and a width (w) of 1000 μm.

Thereafter, as well as in Example 1, a distance between the support plate and the substrate and a rate of change in the distance were obtained. The results thereof are shown in Table 1.

Comparative Example 1

The same procedure as in Example 1 was performed, except that no spacer was formed. Thus, a support plate having no spacer was produced.

Thereafter, as well as in Example 1, a distance between the support plate and the substrate and a rate of change in the distance were obtained. The results thereof are shown in Table 1.

TABLE 1

|  | Height of spacer (μm) | Distance between support plate and substrate (μm) | | | Rate of change in distance between support plate and substrate (%) | | |
| --- | --- | --- | --- | --- | --- | --- | --- |
|  |  | Before process | After process at 150° C. for 1 h | After process at 200° C. for 1 h | Before process | After process at 150° C. for 1 h | After process at 200° C. for 1 h |
| Ex. 1 | 10 | 20.5 | 20.5 | 20.5 | 100.0 | 100.0 | 100.0 |
| Ex. 2 | 30 | 37.3 | 32.8 | 28.8 | 100.0 | 87.9 | 77.2 |
| C. Ex. 1 | 0 | 15.3 | 9.0 | 5.2 | 100.0 | 58.8 | 34.0 |

Abbreviations:
"Ex." stands for "Example".
"C. Ex." stands for "Comparative Example".

As shown in Table 1, degrees that the support plates of Examples 1 and 2 were depressed were smaller than a degree that the support plate of Comparative Example 1, having no spacer, was depressed. In particular, the support plate of Example 1 was not depressed at all. From these, it is considered that the support plates of Examples 1 and 2 do not cause delay in time taken for the step for separating from the support plate the wafer which has been processed.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

A support plate of the present invention makes it possible to stably perform a step for separating from a support plate a wafer which has been processed, while preventing delay in time taken for this step. Therefore, the support plate of the present invention is suitably used for, e.g., various processes using a support plate to be subjected to a semiconductor wafer.

REFERENCE SIGNS LIST

2 Spacer
5 Protrusion
10 Support plate
12 Columnar body
20 Support plate
22 Plate-shaped object
30 Support plate

The invention claimed is:

1. A support plate for supporting a substrate via an adhesive, comprising:
    a plate-shaped part having a surface which is in contact with the adhesive; and
    at least one spacer provided on said surface which is in contact with the adhesive,
    wherein said at least one spacer comprises a protrusion continuously protruding along an outer circumference of said plate-shaped part, and
    wherein said at least one spacer further comprises a plurality of columnar bodies.

2. The support plate as set forth in claim 1, wherein the plate-shaped part is made of glass.

3. A method for processing a substrate, the method comprising:
    (i) supporting a substrate using the support plate of claim 1; and thereafter
    (ii) processing the substrate.

4. The method as set forth in claim 3, wherein said processing the substrate includes subjecting the substrate to a heat treatment.

5. A method of producing the support plate of claim 1, the method comprising:
    laminating a photoresist material on the plate-shaped part; and
    forming the at least one spacer by patterning the photoresist material.

6. A support plate for supporting a substrate via an adhesive, comprising:
    a plate-shaped part having a surface which is in contact with the adhesive; and
    at least one spacer provided on said surface which is in contact with the adhesive,
    wherein said at least one spacer comprises a protrusion continuously protruding along an outer circumference of said plate-shaped part, and
    wherein said at least one spacer further comprises a plurality of plate-shaped objects disposed in a lattice.

7. The support plate as set forth in claim 6, wherein said plate-shaped part is made of glass.

8. A method for processing a substrate, the method comprising:
    (i) supporting a substrate using the support plate of claim 6; and thereafter
    (ii) processing the substrate.

9. The method as set forth in claim 8, wherein said processing the substrate includes subjecting the substrate to a heat treatment.

10. A method of producing the support plate of claim 6, the method comprising:
  laminating a photoresist material on the plate-shaped part; and
  forming the at least one spacer by patterning the photoresist material.

11. A method for processing a substrate, the method comprising:
  supporting a substrate using the support plate of claim 6, with adhesive connecting the substrate to the support plate;
  processing the substrate while the substrate is supported on the support plate;
  after said processing, separating the substrate from the support plate by providing a solution through a plurality of through-holes in the support plate.

12. The method of claim 11, wherein the spacer is configured and arranged to prevent the adhesive from intruding into the through-holes.

13. The method of claim 11, wherein each of the through-holes has a diameter of 10 μm to 1000 μm,
  wherein the through holes cover 20% to 50% of an area of the support plate, and
  wherein the spacer has a height of 5 μm to 500 μm and a width of 10 μm to 5000 μm.

14. A method for processing a substrate, the method comprising:
  supporting a substrate using the support plate of claim 6, with adhesive connecting the substrate to the support plate;
  processing the substrate while the substrate is supported on the support plate;
  after said processing, separating the substrate from the support plate by providing a solution through a plurality of through-holes in the support plate.

15. The method of claim 14, wherein the spacer is configured and arranged to prevent the adhesive from intruding into the through-holes.

16. The method of claim 14, wherein each of the through-holes has a diameter of 10 μm to 1000 μm,
  wherein the through holes cover 20% to 50% of an area of the support plate, and
  wherein the spacer has a height of 5 μm to 500 μm and a width of 10 μm to 5000 μm.

\* \* \* \* \*